(12) United States Patent  
Lin (10) Patent No.: US 8,947,871 B2
(45) Date of Patent: Feb. 3, 2015

(54) PORTABLE ELECTRONIC DEVICE AND SLIDE RAIL DEVICE

(71) Applicant: Wistron Corporation, New Taipei (TW)

(72) Inventor: Tung-Hsien Lin, New Taipei (TW)

(73) Assignee: Wistron Corporation, New Taipei (TW)

( * ) Notice: Subject to any disclaimer, the term of this patent is extended or adjusted under 35 U.S.C. 154(b) by 104 days.

(21) Appl. No.: 13/670,702

(22) Filed: Nov. 7, 2012

(65) Prior Publication Data

US 2013/0329351 A1 Dec. 12, 2013

(30) Foreign Application Priority Data

Jun. 6, 2012 (TW) .............................. 101120321 A (51) Int. Cl.
*H05K 5/00* (2006.01)
*H05K 5/02* (2006.01)
*G06F 1/16* (2006.01)

(52) U.S. Cl.
CPC ............ *H05K 5/0239* (2013.01); *G06K 1/1654* (2013.01); *H05K 5/0226* (2013.01); *G06F 1/1618* (2013.01); *G06F 1/1624* (2013.01); *G06F 1/1637* (2013.01); *G06F 1/1681* (2013.01)
USPC ............ 361/679.27; 361/679.26; 361/679.09; 361/679.55

(58) Field of Classification Search
CPC ................................ H05K 5/0239; H05K 5/02
USPC ......................................... 361/679.27, 679.26
See application file for complete search history.

(56) References Cited

U.S. PATENT DOCUMENTS

| 5,209,448 | A | * | 5/1993 | Hatanaka et al. ............. 248/455 |
| 5,345,362 | A | * | 9/1994 | Winkler .................... 361/679.06 |
| 5,548,478 | A | * | 8/1996 | Kumar et al. ............ 361/679.27 |
| 6,700,775 | B1 | | 3/2004 | Chuang et al. |
| 6,780,019 | B1 | * | 8/2004 | Ghosh et al. ..................... 439/31 |
| 6,940,713 | B2 | * | 9/2005 | Huang et al. ............. 361/679.09 |
| 6,980,420 | B2 | | 12/2005 | Maskatia et al. |
| 6,986,492 | B2 | * | 1/2006 | Huang et al. ............. 248/346.03 |
| 7,239,505 | B2 | * | 7/2007 | Keely et al. .............. 361/679.09 |
| 7,725,988 | B2 | * | 6/2010 | Kim et al. ........................ 16/361 |
| 8,154,868 | B2 | * | 4/2012 | Xu ........................... 361/679.55 |
| 8,363,391 | B2 | * | 1/2013 | Kim et al. ................ 361/679.01 |
| 8,665,589 | B2 | * | 3/2014 | Lin .......................... 361/679.41 |
| 2008/0161075 | A1 | * | 7/2008 | Kim et al. .................. 455/575.4 |

* cited by examiner

*Primary Examiner* — Lisa Lea Edmonds
*Assistant Examiner* — Rashen E Morrison
(74) *Attorney, Agent, or Firm* — Muncy, Geissler, Olds & Lowe, P.C.

(57) ABSTRACT

A portable electronic device including a computer body, a display, and a slide-rail structure is provided. The computer body has a first side edge. The display has a second side edge, a display surface and a back side surface. The slide-rail structure includes a sliding element and a connecting arm. The sliding element having a first combination portion is slidable between a first and a second position. The connecting arm having a second combining portion connected to the first combining portion is rotatably connected to the second side edge. When an included angle between the display surface and the computer body is first angle, the sliding element is in the first position; when the included angle is varied from the first angle to an angle greater than the first angle, the connecting arm pulls the sliding element to the second position. In addition, a slide-rail device is also provided.

14 Claims, 11 Drawing Sheets

PORTABLE ELECTRONIC DEVICE AND SLIDE RAIL DEVICE

CROSS-REFERENCES TO RELATED APPLICATIONS

This non-provisional application claims priority under 35 U.S.C. §119(a) on Patent Application No. 101120321 filed in Taiwan, R.O.C. on 2012 Jun. 6, the entire contents of which are hereby incorporated by reference.

BACKGROUND OF THE INVENTION

1. Technical Field

The present invention relates to a portable electronic device and a slide rail device, and more particularly to a portable electronic device and a slide rail device that have a slide rail structure.

2. Related Art

With the increasing popularization of touch technology, an operating system supporting the touch technology, together with accessory software and hardware thereof, has been adopted in more and more portable electronic devices. However, in a conventional portable electronic device, for example, a notebook computer, when a display is opened relative to a computer body, the display is fixed at a certain angle only by means of a frictional force or an elastic force of a pivoting structure. Therefore, during a touch operation of a user, the display is shaky, which causes inconvenience to the operation.

Another practice is to dispose a support structure at a back side surface of the display. When the display is opened to a specific angle, a bottom side of the display may press against a groove of the computer body, and the back side surface of the display is supported by a support member. However, in this practice the user is typically restricted to opening the display to a specific angle, so that the bottom side of the display presses against the groove of the computer body before the user starts the touch operation.

However, among conventional portable electronic devices having a keyboard, one type does not have the aforementioned open state of tablet computers, so the display can only be flatly attached to the computer body with the display surface downwards; the other type has the aforementioned open state of tablet computers, but the display cannot be flatly attached to the computer body with the display surface downwards.

SUMMARY

Accordingly, in one aspect, the present invention provides a portable electronic device, which includes a computer body, a display, a support member and a slide rail structure. The computer body has a first side edge. The display has a second side edge, a display surface and a back side surface. One end of the support member is rotatably connected to the first side edge, and the other end is rotatably connected to the back side surface. The slide rail structure is disposed in the computer body, and includes a sliding element and a connecting arm. The sliding element is slidable between a first position and a second position, and has a first combining portion. The connecting arm is rotatably connected to the second side edge of the display, and has a second combining portion, and the second combining portion is connected to the first combining portion. When an included angle between the display surface and the computer body is a first angle, the sliding element is in the first position, and when the included angle between the display surface and the computer body is rotated from the first angle to a second angle greater than the first angle, the connecting arm pulls the sliding element from the first position to the second position. In the portable electronic device, the display is enabled to rotate relative to the computer body at any angle through the slide rail structure.

In addition, in another aspect, the present invention provides a slide rail device, which includes a case, a plate, a support member and a slide rail structure. The case has a first side edge. The plate has a second side edge, a first surface and a second surface opposite to the first surface. One end of the support member is rotatably connected to the first side edge, and the other end is rotatably connected to the second surface. The slide rail structure is disposed in the case, and includes a sliding element and a connecting arm. The sliding element is slidable between a first position and a second position, and has a first combining portion. The connecting arm is rotatably connected to the second side edge of the plate, the connecting arm has a second combining portion, and the connecting arm is connected to the first combining portion through the second combining portion. When an included angle between the first surface and the case is a first angle, the sliding element is in the first position, and when the included angle between the first surface and the case is rotated from the first angle to a second angle greater than the first angle, the connecting arm pulls the sliding element from the first position to the second position. In the slide rail device, the plate is enabled to rotate relative to the case at any angle through the slide rail structure.

The present invention is further illustrated in detail below through specific embodiments and drawings.

BRIEF DESCRIPTION OF THE DRAWINGS

The present invention will become more fully understood from the detailed description given herein below for illustration only, and thus not limitative of the present invention, wherein.

DETAILED DESCRIPTION

Figure 1:
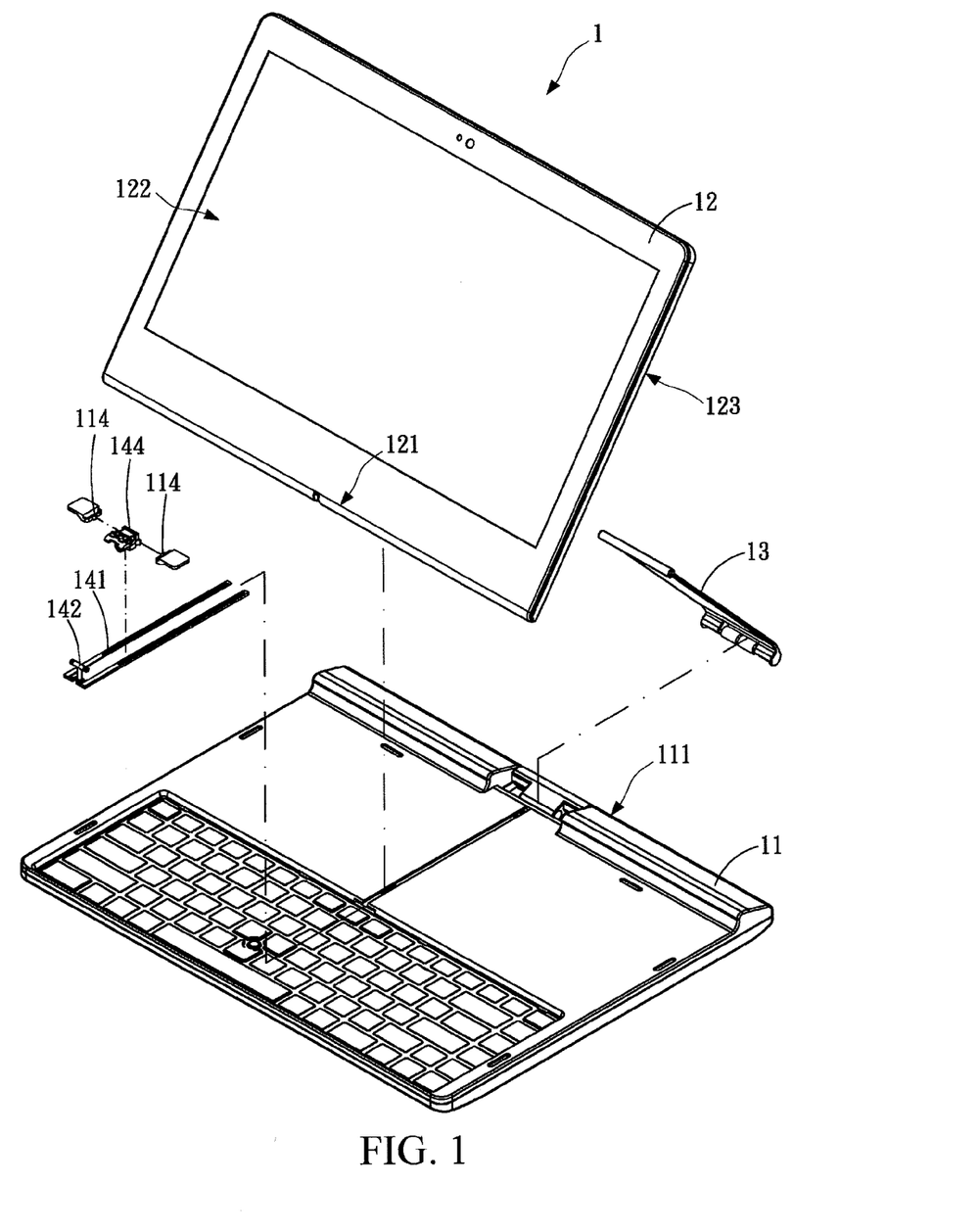
FIG. 1 is an exploded view of a specific embodiment of the present invention.
Figure 2:
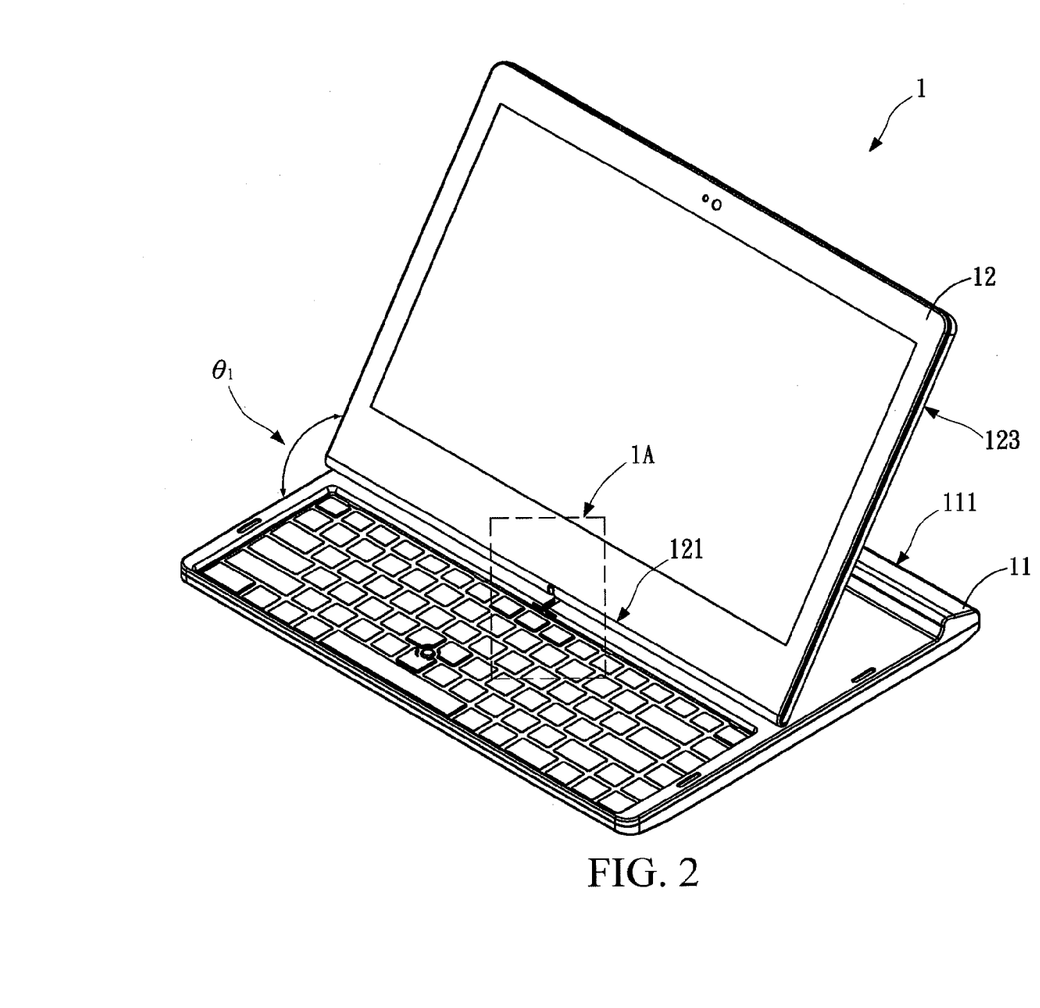
FIG. 2 is a three-dimensional view (I) of the specific embodiment of the present invention.
Figure 3:
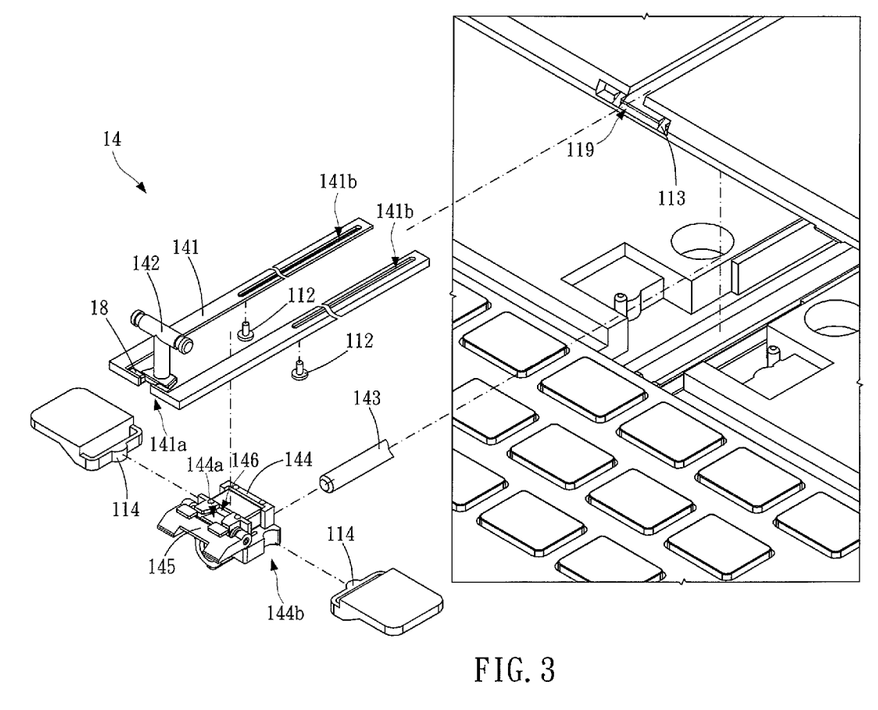
FIG. 3 is a partial enlarged view of a region 1A in FIG. 2.

Please refer to FIG. 1 to FIG. 4, which are respectively an exploded view, a three-dimensional view (I), a partial enlarged view of a region 1A in FIG. 2 and a schematic view (I) of some elements of a specific embodiment of the present invention. A portable electronic device 1 is disclosed, which includes a computer body 11, a display 12, a support member 13 and a slide rail structure 14.

The computer body 11 has a first side edge 111, and further includes electronic elements such as a main board, a processor, a hard disk, a memory, and a keyboard to perform data processing operations. The display 12 has a second side edge 121, a display surface 122 and a back side surface 123 opposite to the display surface 122. One end of the support member 13 is rotatably connected to the first side edge 111, and the other end is rotatably connected to the back side surface 123.

The slide rail structure 14 is disposed in the computer body 11, and includes a sliding element 141 and a connecting arm 142. The sliding element 141 has a first combining portion 141a and is slidable between a first position and a second position. The connecting arm 142 is rotatably connected to the second side edge 121 of the display 12, the connecting arm 142 has a second combining portion 142a, and the second combining portion 142a is connected to the first combining portion 141a.

In an implementation aspect, the sliding element 141 has two guide slots 141b parallel to each other, the computer body has two limiting members 112, and the two limiting members 112 pass through the two guide slots 141b and limit the sliding of the sliding element 141 between the first position and the second position. The limiting members 112 may be screws or pins fixed on the computer body 11 by bolts or pin holes.

Figure 4:
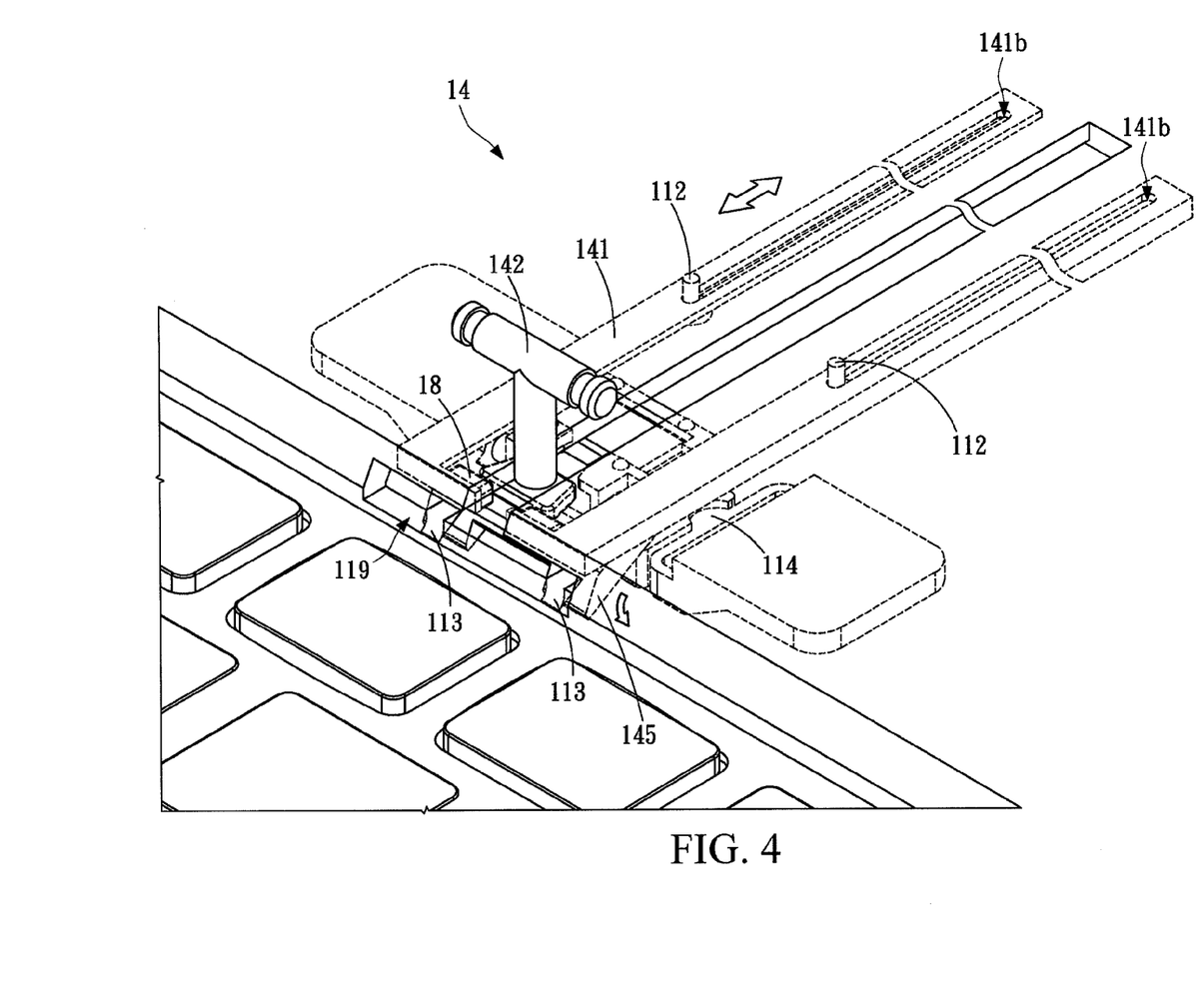
FIG. 4 is a schematic view (I) of some elements of the specific embodiment of the present invention.
Figure 7A:
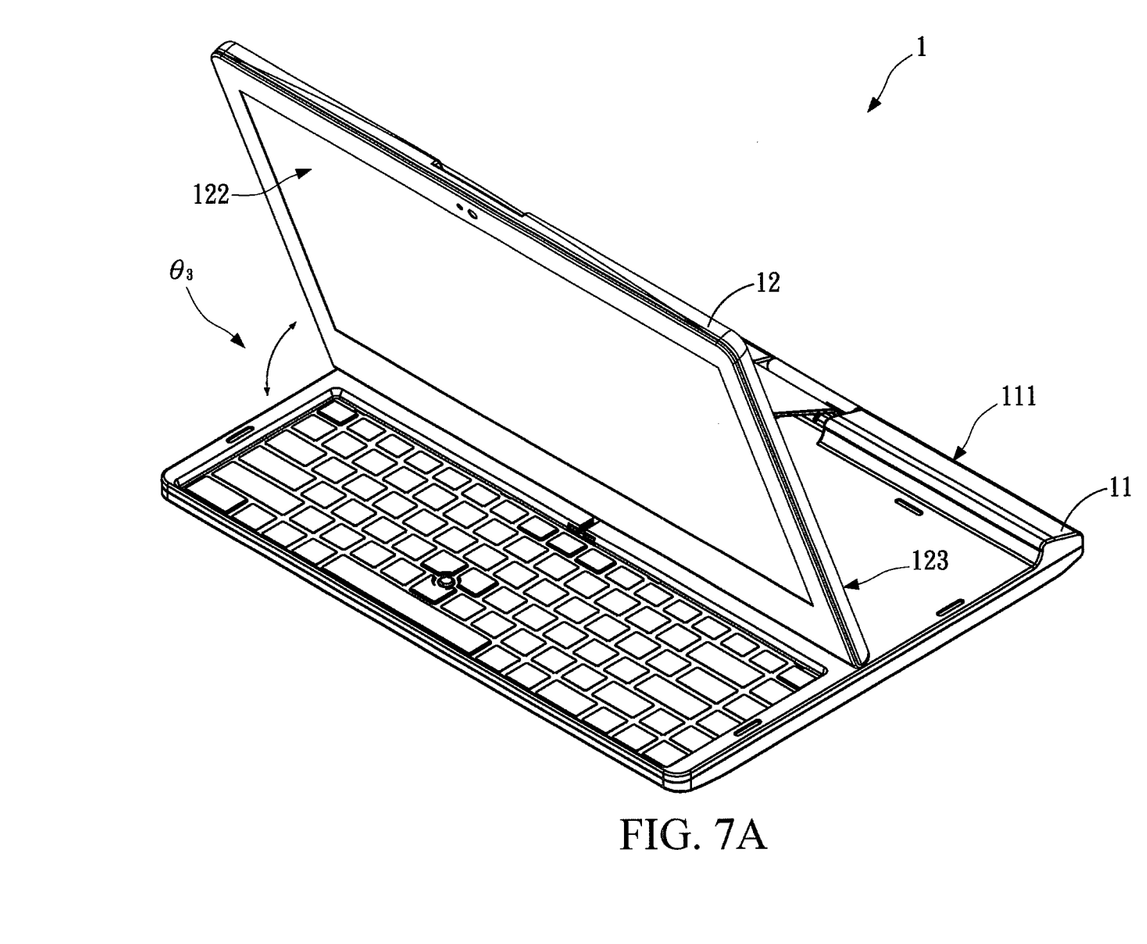
FIG. 7A is a three-dimensional view (IV) of the specific embodiment of the present invention.
Figure 7B:
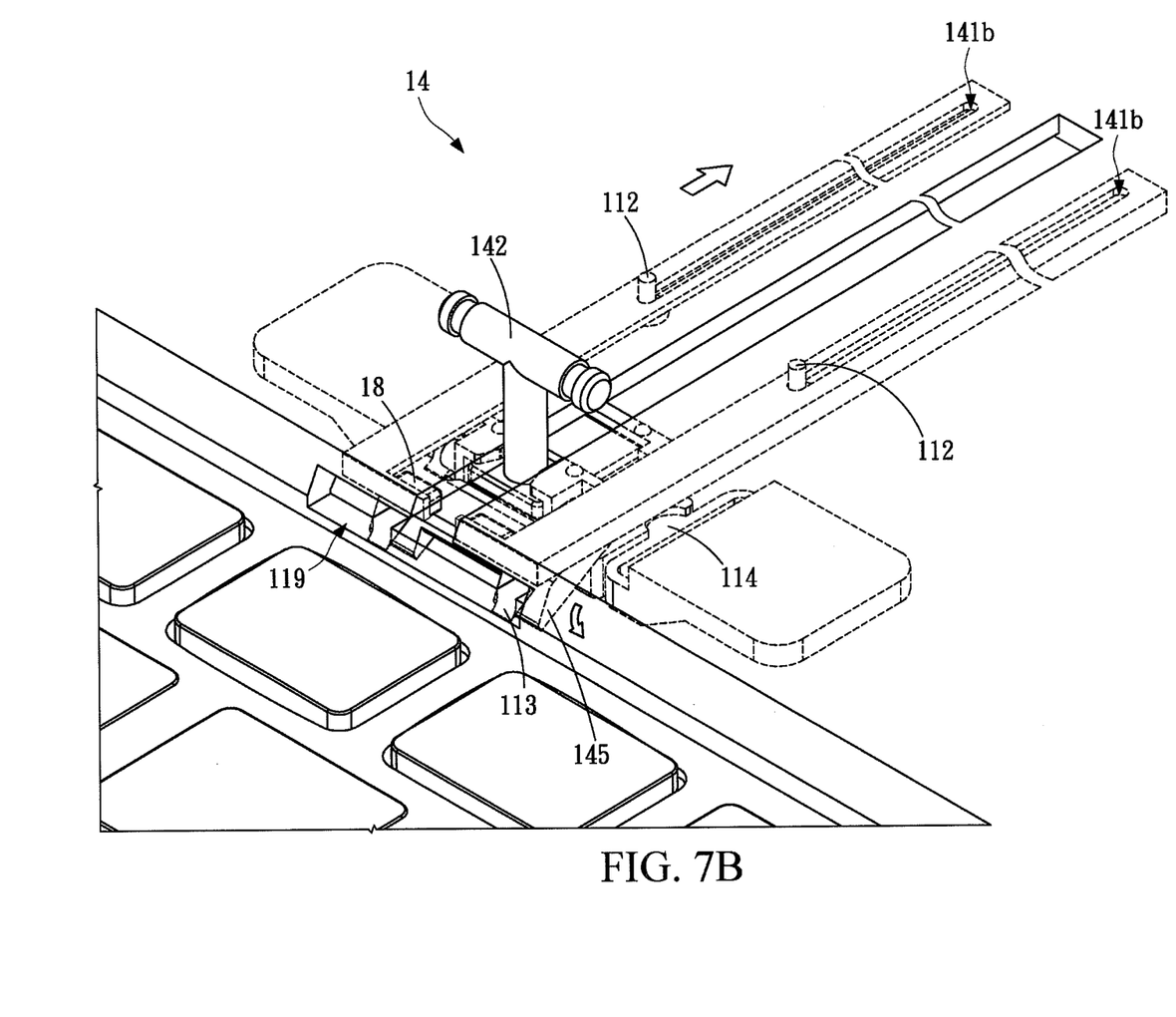
FIG. 7B is a schematic view (IV) of some elements of the specific embodiment of the present invention.
Figure 7C:
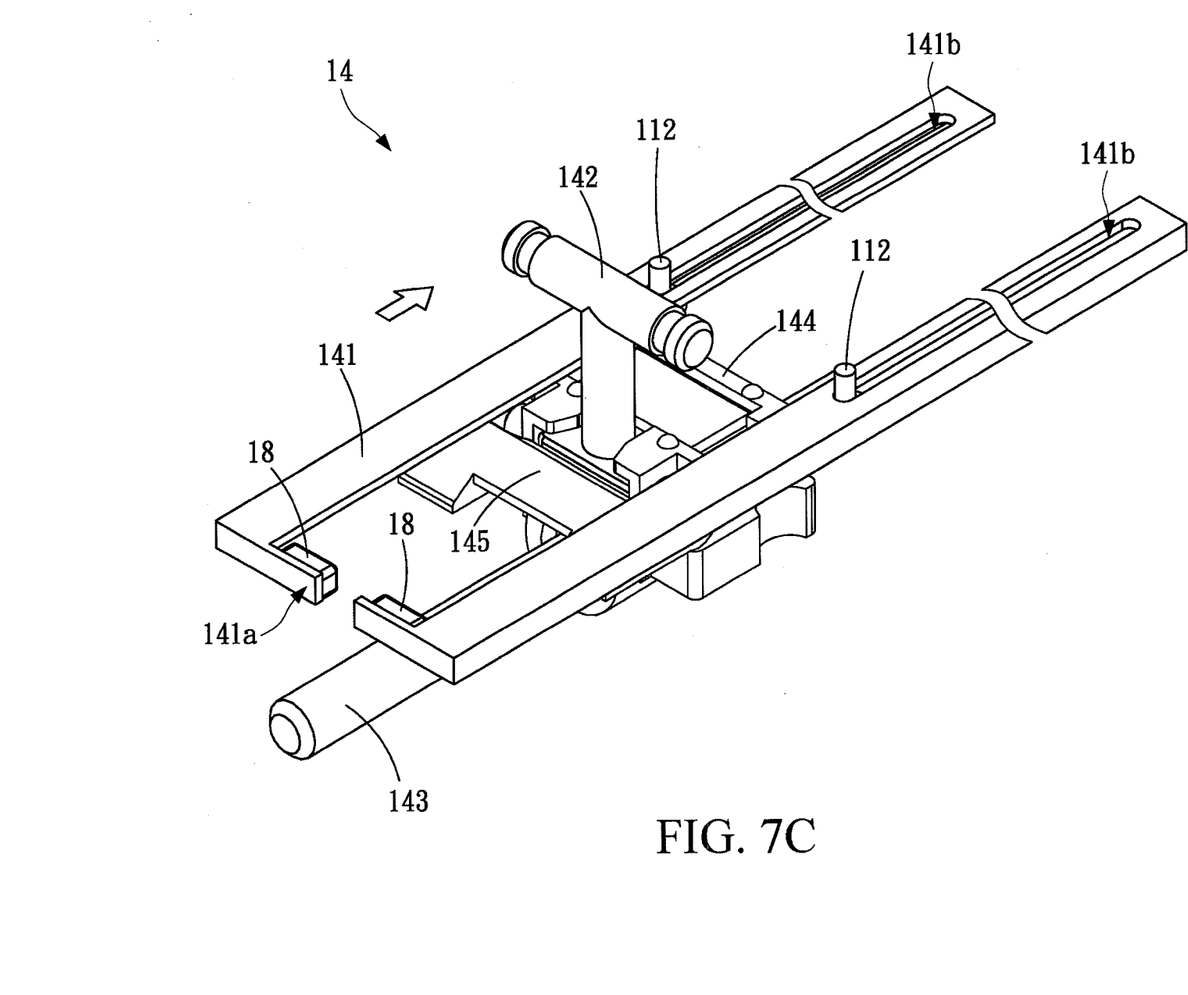
FIG. 7C is a schematic view (IV) of some elements of the specific embodiment of the present invention.

In an implementation aspect, the computer body 11 further includes an opening 119 and a stopper 113, the stopper 113 is disposed adjacent to the opening 119, and the sliding element 141 slides out of the computer body 11 through the opening 119. The slide rail structure 14 further includes elements such as a guide rod 143, a seat 144 and a door panel 145, as shown in FIG. 7C. The guide rod 143 is disposed below the sliding element 142 and is perpendicular to the first side edge 111. The seat 144 has a recess 144a whose geometric shape corresponds to that of the second combining portion 142a. In this embodiment, the recess 144a is used for the second combining portion 142a to be embedded therein. In addition, the recess 144a and the second combining portion 142a may also be attracted to each other by a magnetic force. The seat 144 is connected to the guide rod 143 and is slidable in an axial direction of the guide rod 143, and is movable in a direction perpendicular to the first side edge 111 of the computer body 11. The door panel 145 is flexibly connected to the seat 144 and forms, together with the recess 144a, an accommodating groove 146, and the door panel 145 is rotatable relative to the seat 144, thus capable of opening and closing the accommodating groove, as shown in FIG. 4.

In an implementation aspect, the computer body 11 further includes a fastening member 114 disposed adjacent to the opening 119, the seat 144 has a clipping portion 144b, and when an included angle between the display surface 122 and the computer body 11 is a first angle $\theta_1$, the fastening member 114 is fastened to the clipping portion 144b to fix the seat 144.

In an implementation aspect, the first combining portion 141a of the sliding element 141 or the second combining portion 142a of the connecting arm 142 includes a magnetic element 18, so that the second combining portion 142a is detachably combined with the first combining portion 141a by a magnetic force. In addition, the second combining portion 142a of the connecting arm 142 may be made of a magnetic material, and the first combining portion 141a of the sliding element 141 may be made of a magnetic induction material, which also achieves the efficacy that the second combining portion 142a is detachably combined with the first combining portion 141a by a magnetic force. The magnetic element 18 may preferably be a neodymium-iron-boron permanent magnet the magnetic force of which is stronger than ordinary ferrite magnets.

Please refer again to FIG. 2 and FIG. 3, in which in an implementation aspect, when the included angle between the display surface 122 and the computer body 11 is the first angle $\theta_1$, the sliding element 141 is in the first position. At this time, the sliding element 141 is completely inside the computer body 11 and is not exposed. Moreover, one ends of the two guide slots 141b of the sliding element 141 respectively press against the two limiting members 112, and thus cannot further slide towards the first side edge 111. If the included angle between the display surface 122 and the computer body 11 continuously decreases from the first angle $\theta_1$, since the two guide slots 141b of the sliding element 141 are pressed against by the two limiting members 112 and cannot further move towards the first side edge 111, the first combining portion 141a will be detached from the second combining portion 142a.

In addition, when the included angle between the display surface 122 and the computer body 11 is the first angle $\theta_1$, the keyboard of the portable computer device 1 is completed exposed, so that a user can input a large number of words or perform other operations through the keyboard.

Figure 5A:
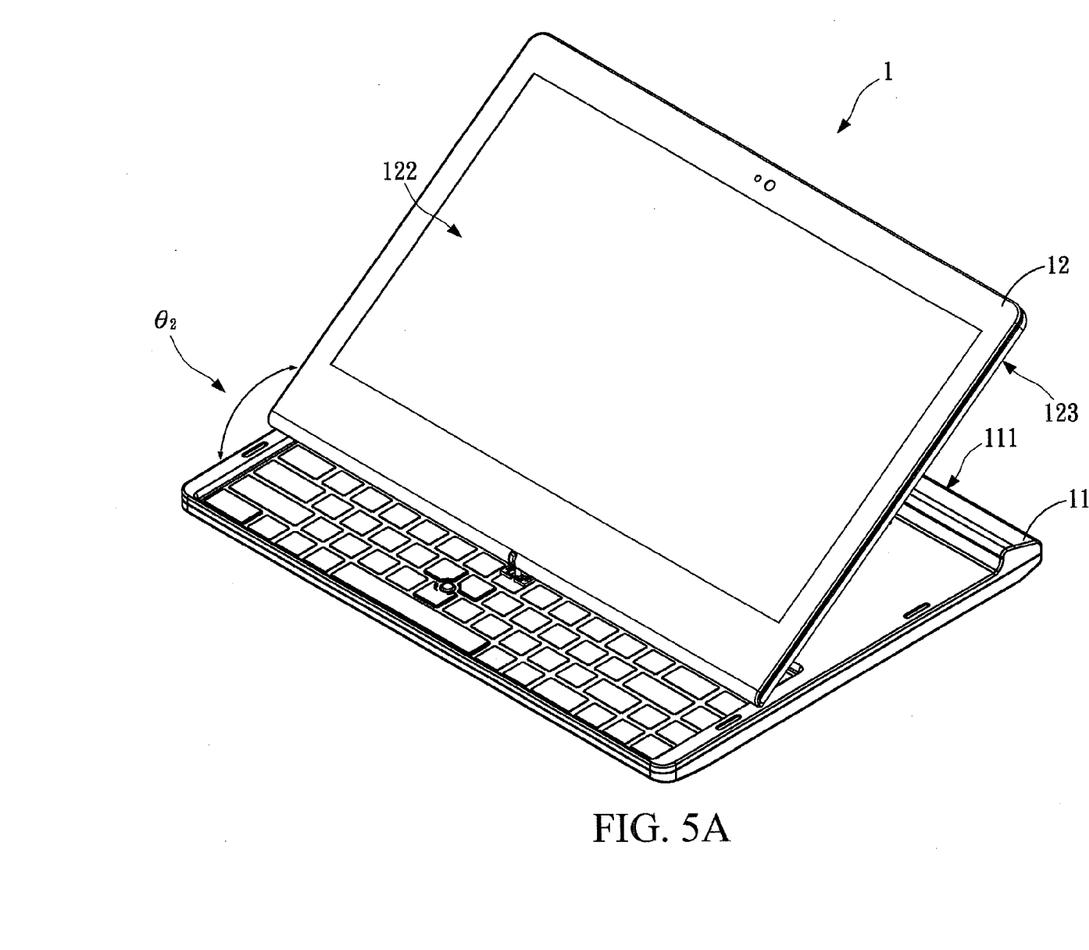
FIG. 5A is a three-dimensional view (II) of the specific embodiment of the present invention.
Figure 5B:
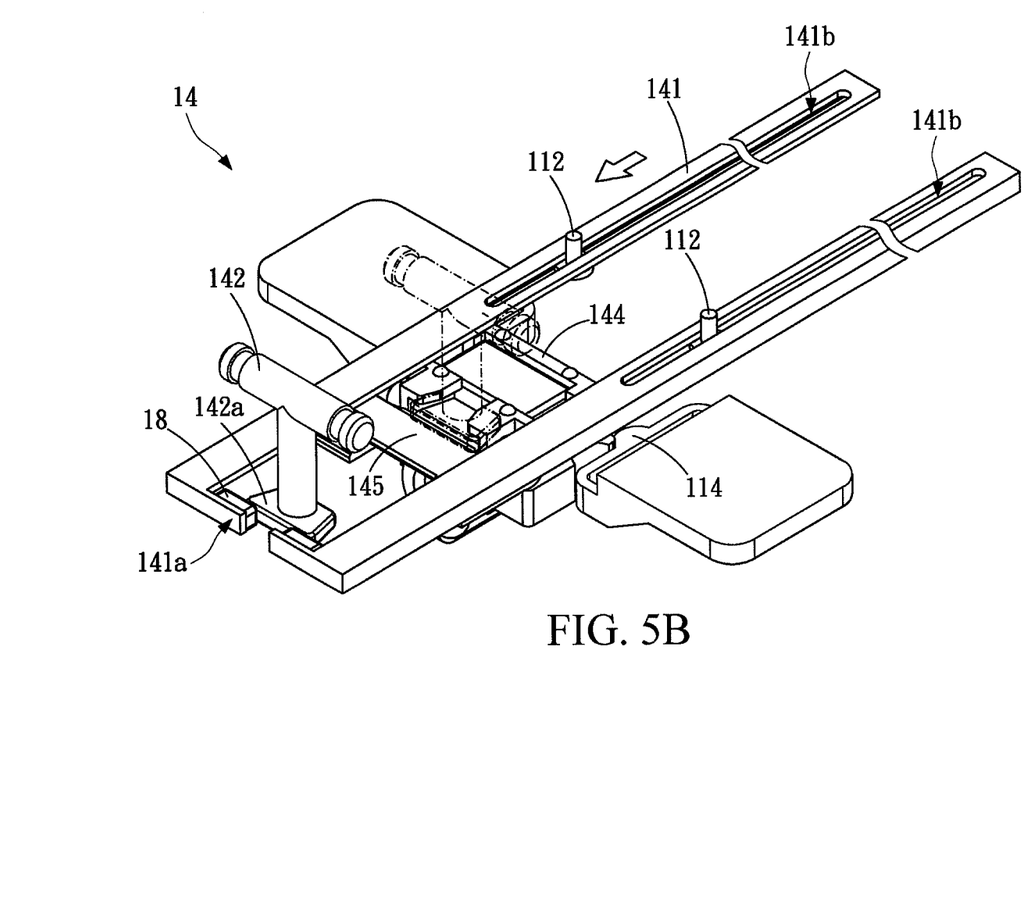
FIG. 5B is a schematic view (II) of some elements of the specific embodiment of the present invention.

Please refer to FIG. 5A and FIG. 5B, which are respectively a three-dimensional view (II) of the specific embodiment of the present invention and a schematic view (II) of some elements of the specific embodiment. When the included angle between the display surface 122 and the computer body 11 is rotated from the first angle $\theta_1$ to a second angle $\theta_2$ greater than the first angle $\theta_1$, the sliding element 141 is pulled out, like a drawer, of the computer body 11 from the opening 119 by the connecting arm 142.

Figure 6A:
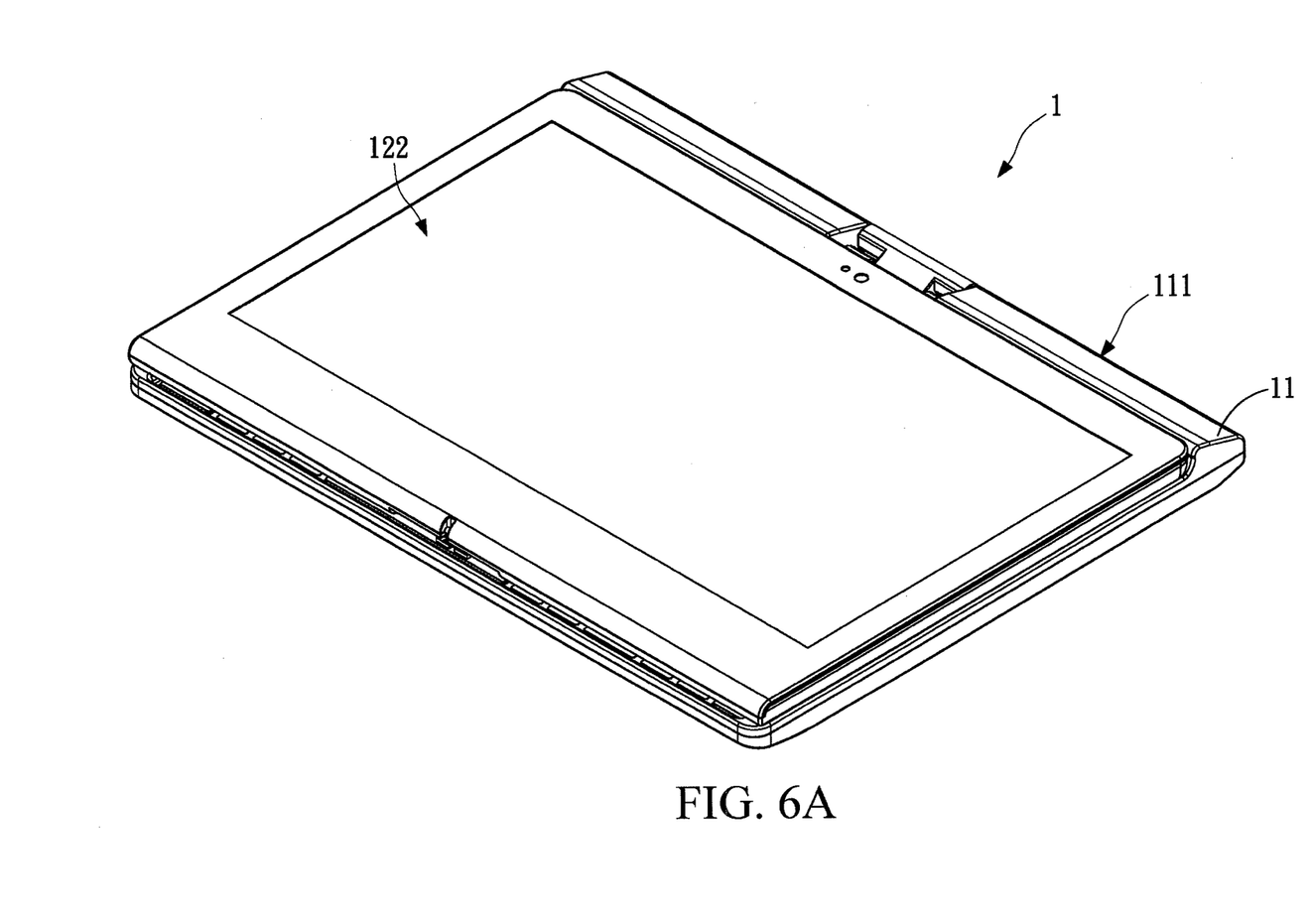
FIG. 6A is a three-dimensional view (III) of the specific embodiment of the present invention.
Figure 6B:
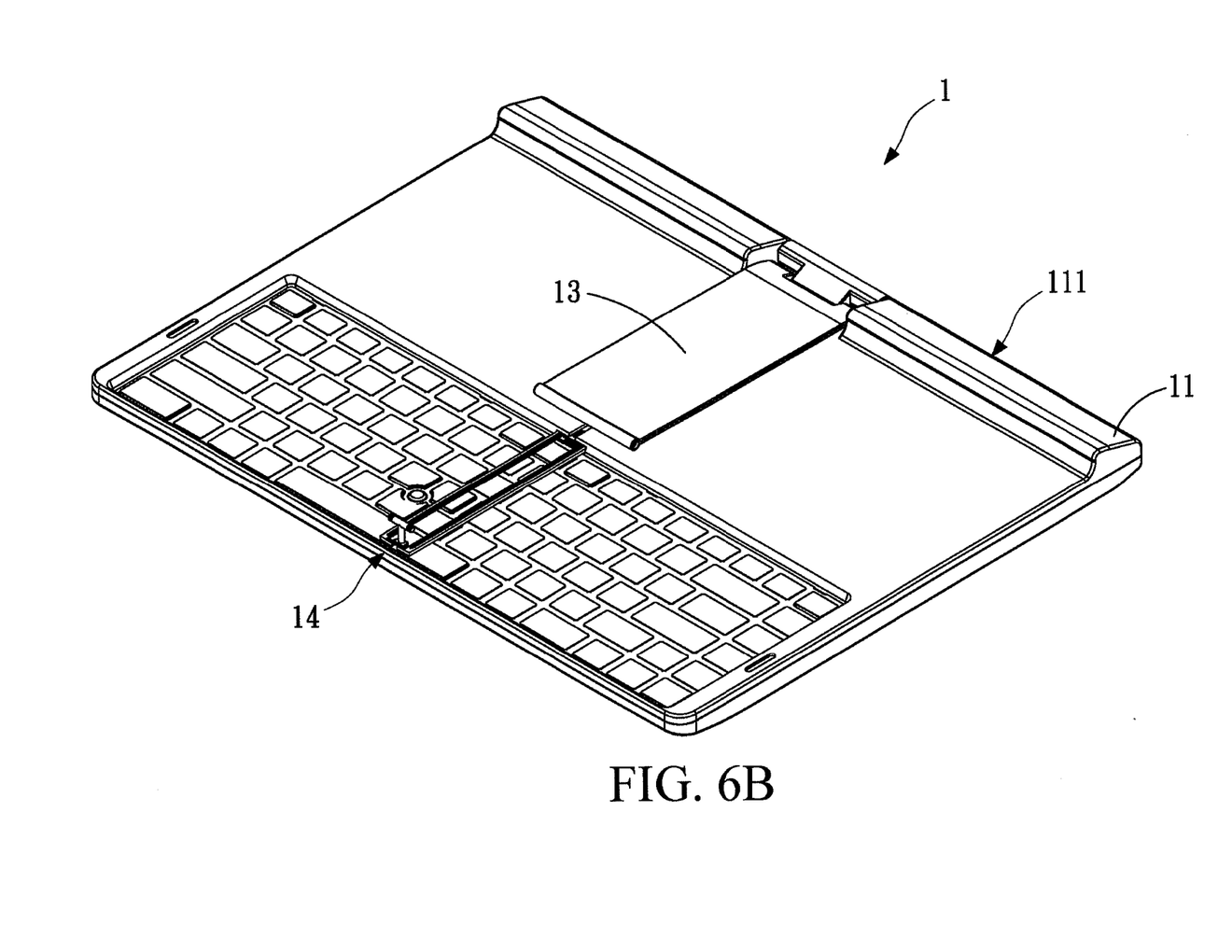
FIG. 6B is a schematic view (III) of some elements of the specific embodiment of the present invention.

Please refer to FIG. 6A and FIG. 6B, which are respectively a three-dimensional view (III) of the specific embodiment of the present invention and a schematic view (III) of some elements of the specific embodiment. When the second angle $\theta_2$ is 180°, the display 12 is attached to the computer body 11 so that the portable computer device 1 looks like a tablet computer. In FIG. 6B, the part of the display 12 is hidden to expose the sliding element 141 blocked by the display 12. In this implementation aspect, when the display 12 is attached to the computer body 11 to assume the appearance of a tablet computer, the sliding element 141 is in the second position outside the computer body 11. In addition, the keyboard adopts a sinking design. In this way, when the sliding element 141 is pulled out, the sliding element 141 is spaced apart from the keyboard by a distance of about 1 mm to 2 mm, without causing friction or interference in operation between the sliding element 141 and the keyboard.

When the included angle between the display surface 122 and the computer body 11 is rotated from the second angle $\theta_2$ back to the first angle $\theta_1$, the connecting arm 142 pushes the sliding element 141 from the second position to the first position.

Please refer to FIG. 2, FIG. 4, FIG. 5A, FIG. 5B, FIG. 7A, FIG. 7B and FIG. 7C, which respectively disclose the operating relations corresponding to the slide rail structure 14 when the portable computer device 1 is in different open states, which are respectively illustrated below.

When the included angle between the display surface 122 and the computer body 11 is rotated from the first angle $\theta_1$ to a third angle $\theta_3$ smaller than the first angle $\theta_1$, since the guide slots 141b of the sliding element 141 are pressed against by the limiting members 112 and cannot slide towards the first side edge 111, the second combining portion 142a of the connecting arm 142 is detached from the first combining portion 141a of the sliding element 141 and is connected to the accommodating groove 146 formed by the door panel 145 and the recess 144a. As the included angle continuously decreases, the connecting arm 142 pushes the seat 144 to move towards the first side edge 111 in the axial direction of the guide rod 143. On the contrary, when the included angle between the display surface 122 and the computer body 11 is rotated from the third angle $\theta_3$ to the first angle $\theta_1$, the stopper 113 presses down the door panel 145 to open the accommodating groove 146, so that the second combining portion 142a of the connecting arm 142 is detached from the accommodating groove 146 and is combined with the first combining portion 141a of the sliding element 141.

As shown in FIG. 2, FIG. 4, FIG. 5A and FIG. 5B, when the included angle between the display surface 122 and the computer body 11 is rotated from the first angle $\theta_1$ to the second angle $\theta_2$ greater than the first angle $\theta_1$, the connecting arm 142 pulls the sliding element 141 out of the computer body 11 from the opening 119. At this time, the clipping portion 144b of the seat 144 is clipped to the fastening member 114, and the door panel 145 is pressed down by the stopper 113 so that the accommodating groove 146 is in an open state to expose the recess 144a. As the included angle between the display surface 122 and the computer body 11 continuously increases, the part of the sliding element 141 exposed out of the computer body 11 becomes larger and larger until the display surface 122 is flatly attached to the computer body 11, as shown in FIG. 6A and FIG. 6B. On the contrary, when the included angle between the display surface 122 and the computer body 11 is rotated from the second angle $\theta_2$ to the first angle $\theta_1$, the sliding element 141 is gradually pushed back into the computer body 11, and when the included angle between the display surface 122 and the computer body 11 is the first angle $\theta_1$, the sliding element 141 enters completely into the computer body 11. If the included angle further decreases at this time, since the accommodating groove 146 is in the open state, and the sliding element 141 is pressed against by the limiting members 112, the second combining portion 142a of the connecting arm 142 will be detached from the first combining portion 141a and enter into the recess 144a.

The aspects of the present invention applied in a portable computer device are illustrated in the foregoing embodiment. However, the present invention may also be applied in implementation aspects other than the portable computer device, for example, in a slide rail device. In the slide rail device, the computer body 11 and the display 12 in the foregoing embodiment are respectively replaced with a case and a plate, the display surface 122 and the back side surface 123 are respectively changed to a first surface and a second surface, and the operations and connection relations of other technical features are as described in the foregoing embodiment. It should be particularly noted herein that, for any device in which a plate, a case and a support member are provided, and two ends of the support member are rotatably connected to the plate and the case respectively, an included angle between the plate and the case of the device can be adjusted based on the concept of the present invention.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A portable electronic device, comprising:
   a computer body, having a first side edge;
   a display, having a second side edge, a display surface and a back side surface opposite to the display surface;
   a support member, having one end rotatably connected to the first side edge and the other end rotatably connected to the back side surface; and
   a slide rail structure, disposed in the computer body, the slide rail structure comprising:
      a sliding element, slidable between a first position and a second position, wherein the sliding element has a first combining portion; and
      a connecting arm, rotatably connected to the second side edge of the display, wherein the connecting arm has a second combining portion, and the second combining portion is connected to the first combining portion,
   wherein when a comprised angle between the display surface and the computer body is a first angle, the sliding element is in the first position, and when the comprised angle between the display surface and the computer body is rotated from the first angle to a second angle greater than the first angle, the connecting arm pulls the sliding element to the second position, and
   wherein the sliding element has two guide slots parallel to each other, the computer body has two limiting members, and the two limiting members pass through the two guide slots and limit the sliding of the sliding element between the first position and the second position.

2. The portable electronic device according to claim 1, wherein the computer body has an opening, the first position is inside the computer body, the second position is outside the computer body, and the connecting arm pulls the sliding element to the second position through the opening.

3. The portable electronic device according to claim 2, wherein when the comprised angle between the display surface and the computer body is rotated from the second angle to the first angle, the connecting arm pushes the sliding element from the second position to the first position.

4. The portable electronic device according to claim 1, wherein the computer body further comprises a stopper disposed adjacent to the opening, and the slide rail structure further comprises:
   a guide rod, disposed below the sliding element and being perpendicular to the first side edge;
   a seat, connected to the guide rod and being slidable in an axial direction of the guide rod, and having a recess; and
   a door panel, flexibly connected to the seat and forming, together with the recess, an accommodating groove, wherein the door panel is rotatable relative to the seat,
   wherein when the comprised angle between the display surface and the computer body is a third angle smaller than the first angle, the second combining portion of the connecting arm is connected to the accommodating groove; and when the comprised angle between the display surface and the computer body is rotated from the third angle to the first angle, the stopper presses down the door panel to open the accommodating groove.

5. The portable electronic device according to claim 4, wherein when the comprised angle between the display surface and the computer body is rotated from the first angle to the third angle, the second combining portion of the connecting arm is detached from the first combining portion of the sliding element and is connected to the accommodating groove, thereby pushing the seat to move in the axial direction of the guide rod.

6. The portable electronic device according to claim 4, wherein the computer body further comprises a fastening member disposed adjacent to the opening, the seat has a clipping portion, and when the comprised angle between the display surface and the computer body is the first angle, the fastening member is fastened to the clipping portion to fix the seat.

7. The portable electronic device according to claim 1, wherein the first combining portion or the second combining portion comprises a magnetic element, and the second combining portion is detachably combined with the first combining portion by a magnetic force.

8. A slide rail device, comprising:
- a case, having a first side edge;
- a plate, having a second side edge, a first surface and a second surface opposite to the first surface;
- a support member, having one end rotatably connected to the first side edge and the other end rotatably connected to the second surface; and
- a slide rail structure, disposed in the case, and comprising:
  - a sliding element, slidable between a first position and a second position, wherein the sliding element has a first combining portion; and
  - a connecting arm, rotatably connected to the second side edge of the plate, wherein the connecting arm has a second combining portion, and the second combining portion is detachably connected to the first combining portion,
- wherein when a comprised angle between the first surface and the case is a first angle, the sliding element is in the first position, and when the comprised angle between the first surface and the case is rotated from the first angle to a second angle greater than the first angle, the connecting arm pulls the sliding element to the second position,
- wherein the sliding element has two guide slots parallel to each other, the case has two limiting members, and the two limiting members pass through the two guide slots and limit the sliding of the sliding element between the first position and the second position.

9. The slide rail device according to claim 8, wherein the case has an opening, the first position is inside the case, the second position is outside the case, and the connecting arm pulls the sliding element to the second position through the opening.

10. The slide rail device according to claim 9, wherein when the comprised angle between the first surface and the case is rotated from the second angle to the first angle, the connecting arm pushes the sliding element from the second position to the first position.

11. The slide rail device according to claim 8, wherein the case has a stopper disposed below the opening, and the slide rail structure further comprises:
- a guide rod, disposed below the sliding element and being perpendicular to the first side edge;
- a seat, connected to the guide rod and being slidable in an axial direction of the guide rod, and having a recess; and
- a door panel, flexibly connected to the seat and forming, together with the recess, an accommodating groove, wherein the door panel is rotatable relative to the seat,
- wherein when the comprised angle between the first surface and the case is a third angle smaller than the first angle, the second combining portion of the connecting arm is connected to the accommodating groove; and when the comprised angle between the first surface and the case is rotated from the third angle to the first angle, the stopper presses down the door panel to open the accommodating groove.

12. The slide rail device according to claim 11, wherein when the comprised angle between the first surface and the case is rotated from the first angle to the third angle, the second combining portion of the connecting arm is detached from the first combining portion of the sliding element and is connected to the accommodating groove, thereby pushing the seat to move in the axial direction of the guide rod.

13. The slide rail device according to claim 11, wherein the case further comprises a fastening member disposed adjacent to the opening, the seat has a clipping portion, and when the comprised angle between the first surface and the case is the first angle, the fastening member is fastened to the clipping portion to fix the seat.

14. The slide rail device according to claim 8, wherein the first combining portion or the second combining portion comprises a magnetic element, and the second combining portion is detachably combined with the first combining portion by a magnetic force.

* * * * *